US012568778B2

(12) United States Patent
Hanson

(10) Patent No.: US 12,568,778 B2
(45) Date of Patent: Mar. 3, 2026

(54) SEMICONDUCTOR FILM PLATING PERIMETER MAPPING AND COMPENSATION

(71) Applicant: Applied Materials, Inc., Santa Clara, CA (US)

(72) Inventor: Kyle M. Hanson, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 407 days.

(21) Appl. No.: 17/974,426

(22) Filed: Oct. 26, 2022

(65) Prior Publication Data

US 2024/0145251 A1 May 2, 2024

(51) Int. Cl.
| | |
|---|---|
| *H01L 21/288* | (2006.01) |
| *C25D 7/12* | (2006.01) |
| *C25D 17/00* | (2006.01) |
| *C25D 17/10* | (2006.01) |
| *H01L 21/67* | (2006.01) |
| *H01L 21/687* | (2006.01) |
| *H01L 21/768* | (2006.01) |

(52) U.S. Cl.
CPC .......... *H01L 21/2885* (2013.01); *C25D 7/123* (2013.01); *C25D 17/007* (2013.01); *C25D*

*17/10* (2013.01); *H01L 21/6723* (2013.01); *H01L 21/68764* (2013.01); *H01L 21/76873* (2013.01)

(58) Field of Classification Search
CPC ............ C25D 7/12–123; C25D 17/007; H01L 21/2885; H01L 21/76873; H01L 2224/11462
See application file for complete search history.

(56) References Cited

U.S. PATENT DOCUMENTS

2017/0307554 A1* 10/2017 Emerson ................ G01R 31/44

* cited by examiner

*Primary Examiner* — Hosung Chung
(74) *Attorney, Agent, or Firm* — Kilpatrick Townsend & Stockton LLP

(57) ABSTRACT

Conditions at the perimeter of the wafer may be characterized and used to adjust current stolen by the weir thief electrodes during a plating process to generate more uniform film thicknesses. An electrode may be positioned in a plating chamber near the periphery of the wafer as the wafer rotates. To characterize the electrical contacts on the seal, a wafer with a seed layer may be loaded into the plating chamber, and a constant current may be driven through the electrode into the conductive layer on the wafer. As an electrical characteristic of this current varies, such as a voltage required to drive a constant current, a mapping characterizing the seal quality or the openings in the mask layer may be generated.

12 Claims, 10 Drawing Sheets

SEMICONDUCTOR FILM PLATING PERIMETER MAPPING AND COMPENSATION

TECHNICAL FIELD

This disclosure generally describes monitoring and adjusting a plating process for a semiconductor wafer. More specifically, this disclosure describes mapping a condition of a wafer seal or opening pattern around the periphery of a wafer, and optionally adjusting current stealing in response during the plating operation to produce uniform film thicknesses.

BACKGROUND

Microelectronic devices, such as semiconductor devices, are fabricated on and/or in wafers or workpieces. A typical wafer plating process involves depositing a metal seed layer onto the surface of the wafer via vapor deposition. A photoresist may be deposited and patterned to expose the seed layer. The wafer is then moved into the vessel of an electroplating processor where electric current is conducted through an electrolyte to the wafer, to apply a blanket layer or patterned layer of a metal or other conductive material onto the seed layer. Examples of conductive materials include permalloy, gold, silver, copper, cobalt, tin, and alloys of these metals. Subsequent processing steps form components, contacts and/or conductive lines on the wafer.

In many or most applications, it is important that the plated film or layer(s) of metal have a uniform thickness across the wafer or workpiece. Some electroplating processors use a current thief, which is an electrode having the same polarity as the wafer. The current thief operates by drawing current away from the edge of the wafer. This helps to keep the plating thickness at the edge of the wafer more uniform with the plating thickness over the rest of the wafer. The current thief may be a physical electrode close to the edge of the wafer. Alternatively the current thief may be a virtual current thief, where the physical electrode is remote from the wafer. In such designs, current from the remote physical electrode is conducted through electrolyte to positions near the wafer.

Electroplating processes in wafer level packaging and other applications are diverse, with variations in process and wafer patterns. Significant plating non-uniformities often occur along the edge of the wafer pattern. Nonuniformities can be causes by irregularities in the electric field due to pattern variations or by mass-transfer non-uniformities near the wafer edge. Accordingly, engineering challenges remain in designing electroplating processors.

SUMMARY

In some embodiments, a semiconductor plating system may include a vessel assembly for holding an electrolyte and a wafer in the electrolyte and a weir thief electrode assembly in the vessel assembly. The weir thief electrode assembly may include a plurality of thief electrodes configured to steal current during a plating process. The system may also include an electrode positioned in the vessel assembly to be submerged in the electrolyte during the plating process; and a controller programmed to cause a current to flow from the electrode to the wafer and to record an electrical characteristic associated with the current measured while the current flows from the electrode to a conductive layer on the wafer.

In some embodiments, a method of characterizing seals around wafers during plating processes may include causing a wafer to be rotated in a plating chamber. The wafer may be enclosed in a carrier that forms a seal around a periphery of the wafer, and the seal may be electrically coupled to a conductive layer on the wafer through electrical contacts inside the seal. The method may also include causing current to flow from an electrode in the plating chamber to the conductive layer on the wafer while the wafer is being rotated. The current may then flow through the conductive layer into the electrical contacts inside the seal. The method may additionally include causing an electrical characteristic associated with the current to be measured while the current flows from the electrode to the conductive layer; and generating a characterization of how well the seal is electrically coupled to the conductive layer on the wafer around the periphery of the wafer based on the electrical characteristic.

In some embodiments, a method of characterizing wafers during plating processes may include causing a wafer to be rotated in a plating chamber. The wafer may include openings in a top layer that expose areas of a conductive layer underneath the top layer. The method may also include causing current to flow from an electrode in the plating chamber to the conductive layer on the wafer while the wafer is being rotated; causing an electrical characteristic associated with the current to be measured while the current flows from the electrode to the conductive layer; and generating a characterization of the openings in the top layer based on the electrical characteristic.

In any embodiments, any and all of the following features may be implemented in any combination and without limitation. The electrode need not be part of the weir thief electrode assembly, and the electrode does need not steal current from the wafer during the plating process. The electrode may be mounted in a housing of the vessel assembly. The controller may be further programmed to adjust an amount of current stolen by the plurality of thief electrodes during the plating process. The electrode and the wafer may be submerged in electrolyte during the plating process such that the current flows from the electrode to the wafer through the electrolyte. The system may also include a second electrode positioned in the vessel assembly positioned above an interior radius of the wafer. The controller may be further programmed to cause a second current to flow from the second electrode to the wafer and to record a second electrical characteristic associated with the second current measured while the second current flows from the second electrode to the conductive layer. The plating process may include an electroplating process to add a conductive material to a portion of the wafer. The current may include a constant current from a current source. The electrical characteristic associated with the current may include a voltage required to drive the constant current as the wafer rotates. The method/operations may also include generating a map of voltages corresponding to locations around the periphery of the wafer, where higher voltages may represent areas where the seal is not sufficiently electrically coupled to the conductive layer through the electrical contacts inside the seal. The conductive layer on the wafer may include a uniform seed layer that extends underneath the seal, and the uniform seed layer may be a top-most layer on the wafer without a mask layer on top of the uniform seed layer. The current may include a constant current from a current source and the electrical characteristic associated with the current comprises a voltage required to drive the constant current as the wafer rotates. The method may also include generating a map of voltages corresponding to locations around a periphery of the wafer, where higher voltages may represent locations where openings in the top layer are most sparse. The method/operations may also include adjusting an amount of current stolen by one or more thief electrodes based on the characterization of the openings in the top layer. The one or more thief electrodes may steal more current at locations on the wafer where the openings in the top layer are most sparse. The one or more thief electrodes may steal less current at locations on the wafer where the openings in the top layer are most dense. The method/operations may also include combining the characterization of how well the seal is electrically coupled to the conductive layer on the second wafer and the characterization of the openings in the top layer to generate a mapping of the wafer.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

Electroplating processes in wafer-level packaging and other applications are diverse, with variations in process and wafer patterns. Significant plating non-uniformities often occur along the edge of the wafer pattern. Nonuniformities can be causes by irregularities in the electric field due to pattern variations or by mass-transfer non-uniformities near the wafer edge. For example, variations in the opening pattern in the photoresist layer may channel more current into some openings than others. Additionally, variations in how well the seal of the wafer carrier electrically couples to the seed layer on the wafer may cause additional variations in film thickness.

The embodiments described herein solve these and other technical problems by characterizing the conditions at the perimeter of the wafer and optionally adjusting current stolen by the weir thief electrodes during the plating process to generate more uniform film thicknesses. An electrode may be positioned in the chamber near the periphery of the wafer as the wafer rotates. To characterize the electrical contacts on the seal, a wafer with a uniform exposed conductive layer (or seed layer) may be loaded into the plating chamber, and a constant current may be driven through the electrode into the conductive layer on the wafer. As an electrical characteristic of this current varies, such as a voltage required to drive a constant current, a mapping characterizing the seal quality may be generated. Higher voltages may correspond to locations where the electrical contacts on the seal are beginning to fail.

In addition to characterizing the seal contact, this technique may also be used to characterize a wafer with a patterned set of openings. The openings may be defined by a blocking layer, such as a photoresist layer that defines the pattern for the plating process. The wafer may be rotated while electrical current flows from the electrode into the openings on the wafer. When more voltage is required to drive the current, this may correspond to locations where the openings are more sparse, while less voltage is required to drive current into locations where the openings are more dense. This mapping characterizing the openings on the wafer may then be used to adjust the current stolen by the weir thief electrodes during the plating process. Additionally, the ring mapping characterizing the seal contacts may be subtracted from the wafer mapping characterizing the openings to further monitor the quality of the seal during the seal lifetime.

Figure 1:
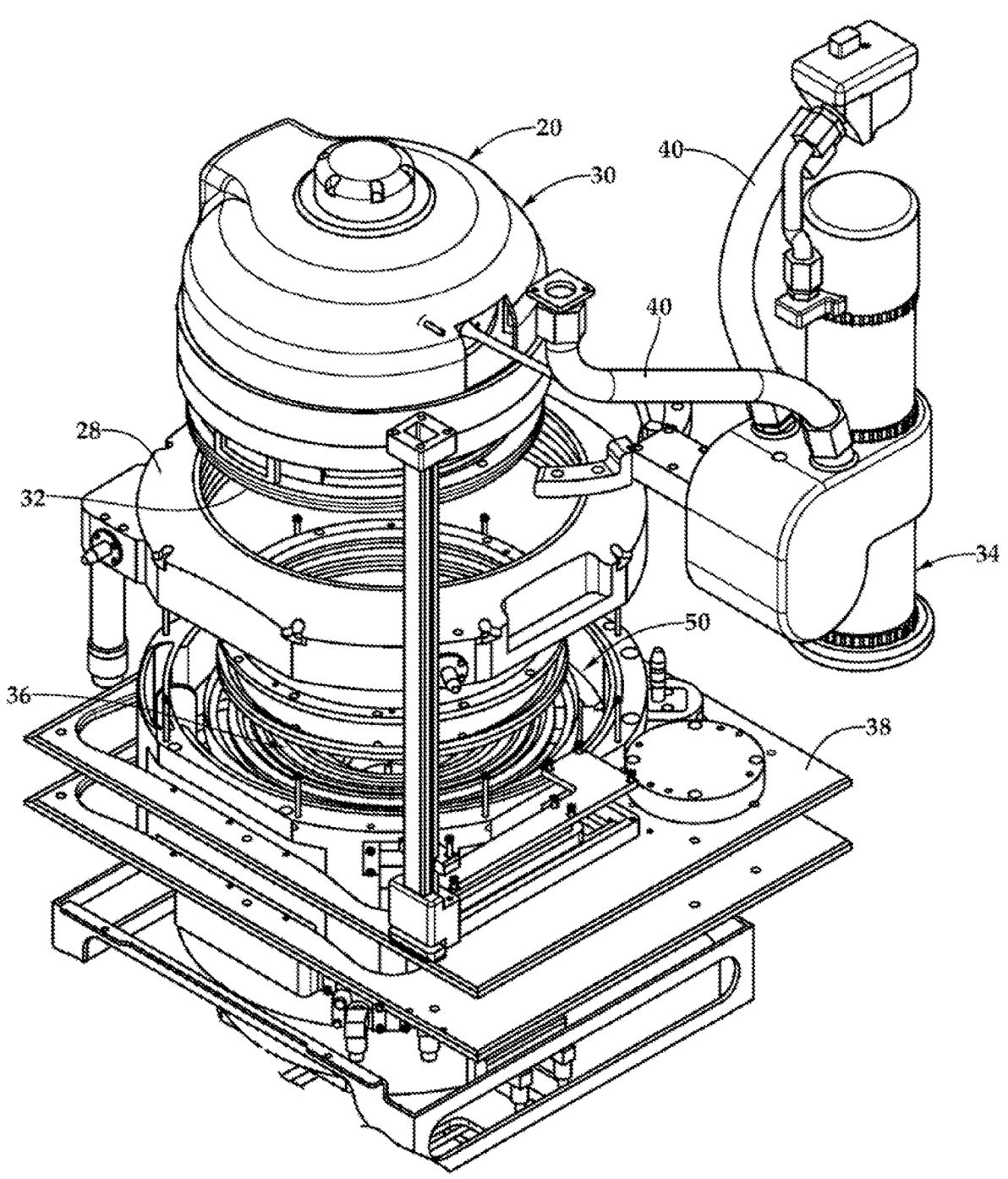
FIG. 1 illustrates an electroplating system, according to some embodiments.

FIG. 1 illustrates an electroplating system 20 having a head 30 positioned above a vessel assembly 36, according to some embodiments. For example, the Nokota® Vmax Pro electrochemical deposition chamber from Applied Materials® may be used as the electroplating chamber 20 described herein, however, any other plating system may also use without limitation. A single system 20 may be used as a standalone unit. Alternatively, multiple systems 20 may be provided in arrays within an enclosure, with wafers or workpieces loaded and unloaded into and out of the systems 20 by one or more robots. The head 30 may be supported on a lift or a lift/rotate unit 34, for lifting and/or inverting the head to load and unload a wafer into a rotor 32 in the head, and for lowering the head 30 into engagement with the vessel assembly 36 for processing. The rotor 32 may include a contact ring that makes electrical contact with a wafer held in the rotor during processing. Electrical control and power cables 40 linked to the lift/rotate unit 34 and to internal head components may lead up from the system 20 to facility connections, or to connections within a multi-processor automated system. A rinse assembly 28 having tiered drain rings may be provided above the vessel frame 50.

Figure 2:
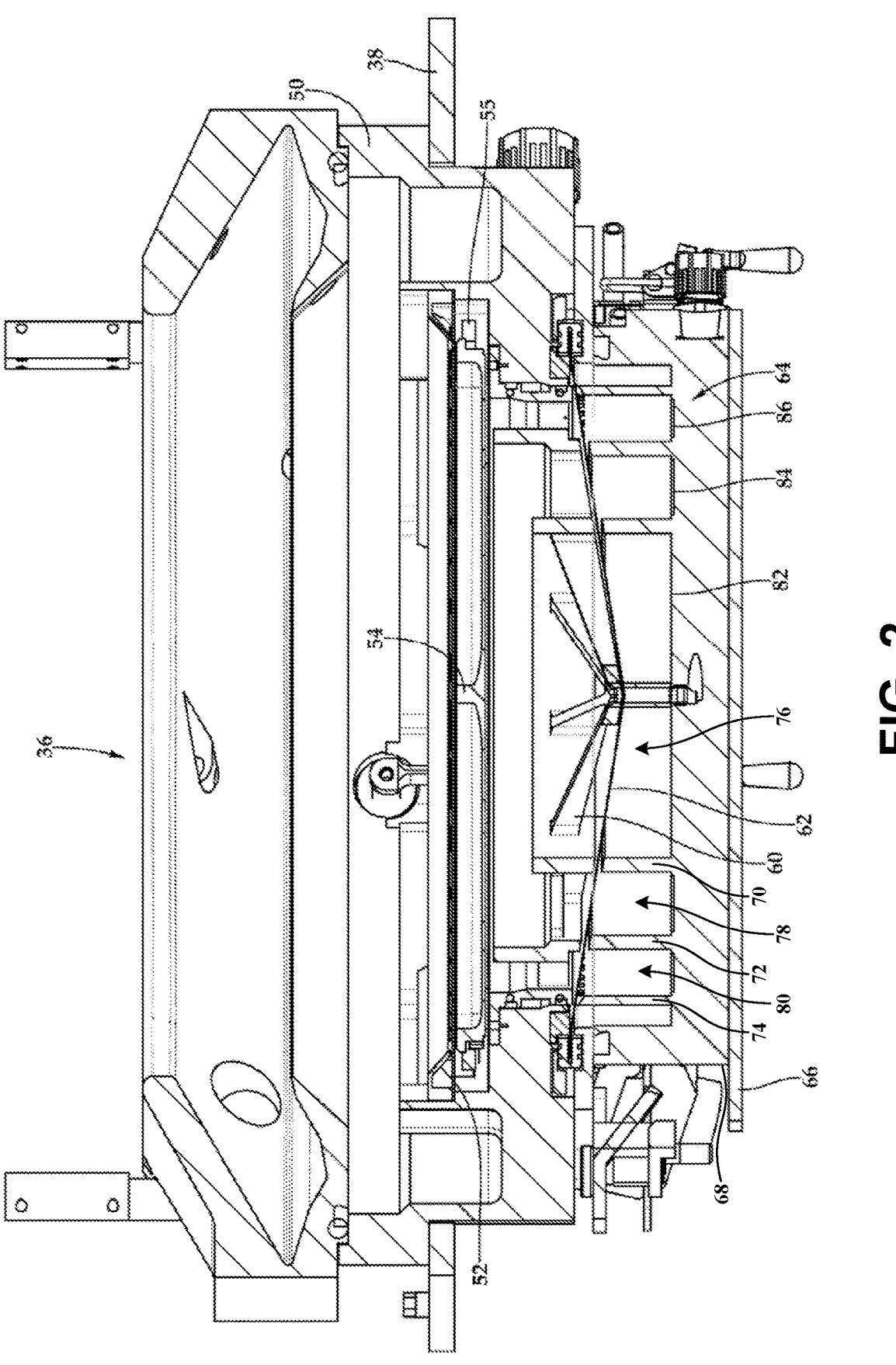
FIG. 2 illustrates a side view of a vessel assembly, according to some embodiments.

FIG. 2 illustrates a side view of the vessel assembly 36, according to some embodiments. A segmented weir thief electrode assembly 52 may be located near the top of the vessel frame 50. A paddle 54 may be provided in the vessel assembly 36 below the level of the segmented weir thief electrode assembly 52. For example, the paddle 54 may be a paddle insert having parallel spaced apart blades extending across a paddle ring. The paddle insert is attachable to a paddle frame 55 in the vessel frame 50. A paddle actuator on a vessel mounting plate 38 may move the paddle.

The vessel assembly 36 may include an anode assembly 64 having a lower cup 68 including a first ring 70, a second ring 72, and a third ring 74. These rings divide the anode assembly into a first or inner anode chamber 76, a second or middle anode chamber 78, and a third or outer anode chamber 80. A first anode electrode 82 may be positioned at the bottom of the inner anode chamber 76. A second anode electrode 84 may be positioned at the bottom of the middle anode chamber 78. A third anode electrode 86 may be positioned at the bottom of the outer anode chamber 80. Although various forms of anode electrodes may be used, in the example shown, each of the first, second, and third anodes may be a flat metal ring. Each of the first, second, and third anode electrodes may be connected to separately controllable power supplies, or to separate channels of a multi-channel power supply (not shown) to allow the electric current supplied by each of the first, second, and third anodes to be independently controlled.

An upper cup 60, made of a dielectric material, may be positioned on top of the lower cup 68. The upper cup 60 may have rings and chambers corresponding to, and aligned over the rings and chambers of the lower cup 68. A vessel membrane 62 between the lower cup 68 and the upper cup 60 passes electric current while preventing movement of electrolyte or particles. The upper cup 60 and the vessel membrane 62 may form a vessel or bowl for holding an electrolyte, such as a catholyte. The lower cup 68 may hold a second electrolyte, such as an anolyte, separated from the catholyte by the vessel membrane 62. During processing, the paddle actuator moves the paddle 54 to agitate the catholyte contained in the upper cup 60. The paddle moves back and forth within a paddle travel dimension, such as an oscillating, start/stop, stagger, etc., motion.

Figures 3A, 3B:
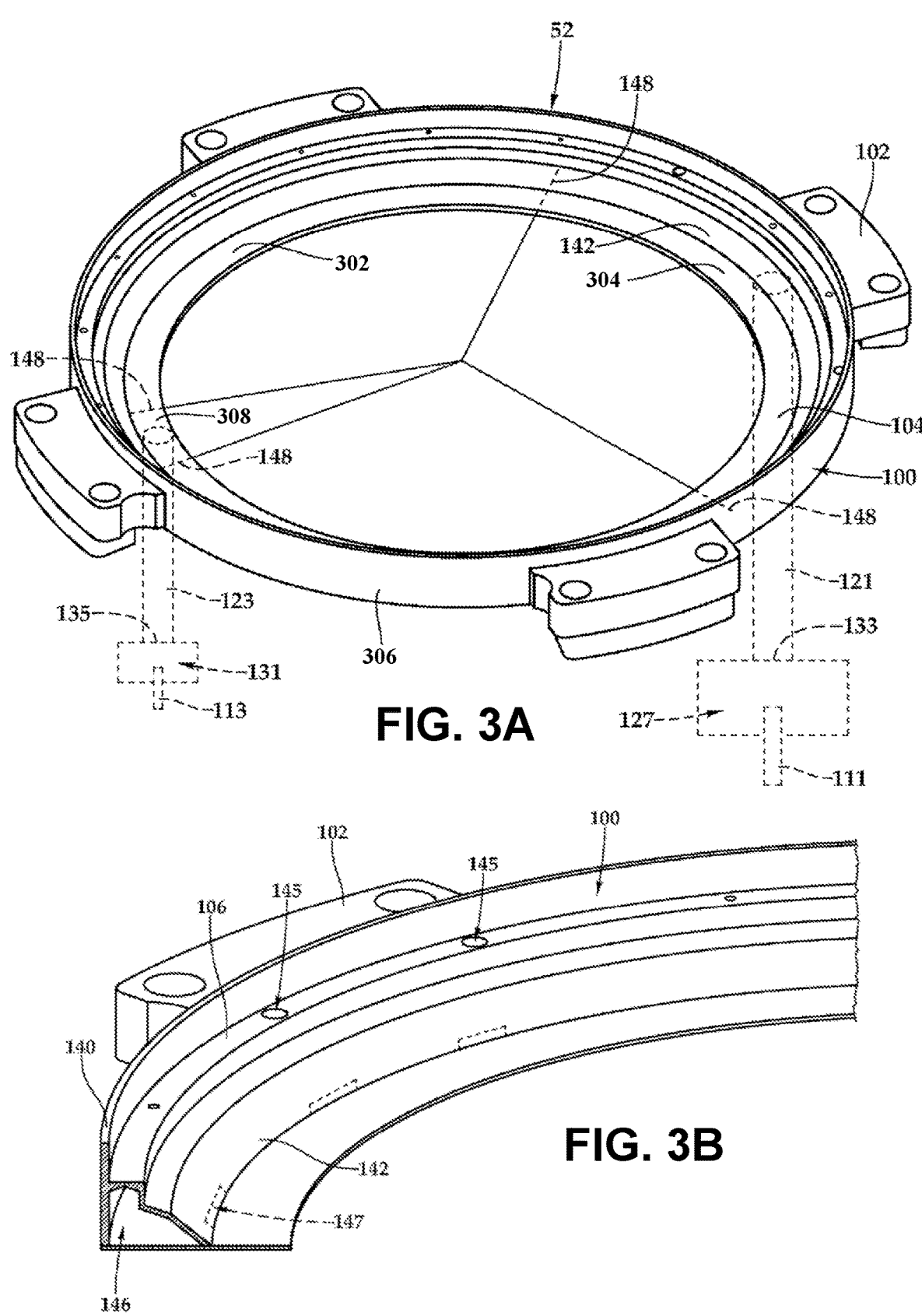
FIGS. 3A-3B illustrate a segmented weir thief electrode assembly, according to some embodiments.

FIGS. 3A-3B illustrate a segmented weir thief electrode assembly 52, according to some embodiments. The weir thief electrode assembly 52 may include a weir frame 100 attached to a weir ring 104, both made of a dielectric material. The weir frame 100 may be a circular ring having radially spaced apart lugs 102 for attaching the segmented weir thief electrode assembly 52 to the vessel frame 50. A cylindrical weir lip 140 on the weir frame 100 extends up may determine the level of catholyte in the upper cup 60. During certain process steps, catholyte may flow out of the upper cup 60 over the cylindrical weir lip 140 and into the weir channel. The weir frame 100 may have an angle section 142 extending up from the weir ring 104 adjoining a plane section 106 which may be perpendicular to the cylindrical weir lip 140. A plenum 146 containing catholyte extends around inside of the weir frame 100.

The plenum 146 may be divided into four virtual thief electrode segments 302, 304, 306, 308 by interior walls 148 shown by dotted lines in FIG. 3A. The four virtual thief electrode segments 302, 304, 306, 308 are referred to as virtual thief electrode segments because need do not include a physical thief electrode. Rather, the physical thief electrodes associated with the virtual thief electrodes are located remotely from virtual thief electrode segments 302, 304, 306, 308. Electrolyte in the vessel assembly provides a current flow path from the virtual thief electrode segments to the physical thief electrodes, as described below. Segments 302 and 306 may both subtend a sector of 130 to 150 degrees and nominally 140 degrees. Segment 304 may subtend a sector of 70 to 90 degrees and nominally 80 degrees. Segment 308 is a local narrow sector subtending 1 to 15 degrees and nominally 10 degrees, and may be fit in between the ends of the two adjacent segments 302 and 306.

Holes 145 through the plane section 106 are aligned on a diameter of the plenum which is greater than the inner diameter of the weir ring. The holes 145 allow the virtual thief electrode segments to influence the electric field in the vessel assembly primarily near the edges of the wafer, by providing a current flow pathway from the catholyte in the plenum 146 into the upper cup 60. Alternatively, slots 147 adjoining the weir ring 104 as shown in dotted lines in FIG. 3B, may be used instead of the holes 145, although the slots are more susceptible to bubble trapping. The holes 145 or slots 147 may be spaced apart at intervals of 15 to 25 degrees, or at 20 degrees. The hole diameters vary to provide uniform distribution of thief current in each segment.

Four physical thief electrodes may be provided in four thief electrode cups attached to the bottom of the vessel frame 50 around the outside of the anode assembly 64. For example, the second and fourth physical thief electrodes 111 and 113 are shown schematically in FIG. 3A, and may be physically aligned vertically under the second and fourth segments 304 and 308. Each physical thief electrode may be electrically connected to separate power supply channels. Thief electrolytes (i.e., "thiefolytes") may be contained in chambers in thief electrode cups by thiefolyte membranes. The thiefolytes may be electrically in contact with the corresponding physical thief electrodes. Thief electrode channels or passageways filled with the catholyte may extend up from the thiefolyte membranes into the plenum 146 corresponding to the segments 302, 304, 306, 308 of the segmented weir thief electrode assembly 52. For example, Second and fourth thief electrolytes (i.e., second and fourth "thiefolytes") are contained in second and fourth chambers 127 and 131 in second and fourth electrode cups by second and fourth membranes 133 and 135 in FIG. 3A. The second and fourth thiefolytes are electrically in contact with the second and fourth physical thief electrodes 111 and 113, respectively. Second and fourth thief electrode channels 121 and 123 filled with the catholyte extend up from the second and fourth thiefolyte membranes into the plenums of the second and fourth segments 304 and 308 of the segmented weir thief electrode assembly 52.

In use, a wafer having a metal seed layer is loaded into the rotor of the head 30. The lift/rotate unit 34 flips over and lowers the wafer into the vessel assembly 36 until at least the seed layer contacts the catholyte in the upper cup. The head 30 may rotate the wafer to even out uneven plating factors. The paddle actuator moves the paddle 54 underneath the wafer. The power supply provides specified time varying direct (positive) current independently to the first, second and third anodes, 82, 84 and 86 according to a preprogrammed schedule adapted to the specific wafer to be electroplated. The power supply also provides specified time varying direct (negative) current independently to the first, second, third and fourth physical current thief electrodes, which current flows through the thiefolytes and the catholyte in thief channels of the first, second, third and fourth virtual electrodes. Each virtual thief segment distributes the current circumferentially through a set of variable-sized openings, which may be holes 145 or slots 144. Catholyte from inlets into the thief channels 120-123, above the thief membranes, flows into the plenum 146 and out the holes 145 in the top of the plenum. Use of the up-facing orientation of the holes 145 allows trapped bubbles in the catholyte to escape from the plenum 146.

Since current density across the wafer may be controlled by adjusting the current of the anodes and the virtual current thieves, the system 20 can better process wafers over a range of parameters. The design of the virtual thief electrodes forces thief current to pass between lower surfaces of the contact ring in the head and the top surface of the weir ring 104. This causes the effect of the segments 302, 304, 306, and 308 to be focused near the edge of the wafer. As a result, required thief currents are lower and more focused control over the electric field at the edge of the wafer is provided. Radial current density control and circumferential current density control may be achieved by adjusting anode and thief currents. Measurements of plating thickness of prior wafer can be used to adjust these currents. Initial currents can be set from a model that uses process conditions as inputs (e.g., bath conductivity of anolyte and catholyte, wafer current, seed resistance, pattern open area, pattern edge exclusion, pattern feature sizes, and intended plating thickness).

The current or voltage supplied by the power supply to each thief segment is independently controlled, for example with a current in the range of 10 mA to 5 A, a current rise time of 100 mS or less, and voltages of 0V to −60V. Current and/or voltage control may be synchronized with wafer position (via control of the motor in the head spinning the rotor) to enable precise circumferential uniformity control of the electroplating at the edge of the wafer. The wafer position may vary with a continuous wafer rotation. The wafer position may include pauses at fixed wafer angular positions or include changes in wafer rotational speed. The current and/or voltage may increase or decrease in time according to wafer position and angular rotation speed. The current and/or voltage may increase or decrease in time according to wafer position and angular rotation speed and based upon deposition thickness measurements of a prior wafer (i.e. feedback control). The current and/or voltage may increase or decrease in time according to wafer position and angular rotation speed and based upon a model or measurements of the local edge pattern density.

While the thief electrodes in the weir assembly may be adjusted to change the way that material is plated on the wafer during rotation, these thief electrodes are not configured to provide any measurements or feedback that might help characterize the wafer in real time. The embodiments described herein augment the plating chamber described above by adding one or more additional electrodes to the plating chamber. These electrodes may be used specifically to characterize various aspects of the wafer. For example, a current may be passed from an electrode to the wafer, and the resulting voltage required to drive that current may be used to characterize an electrical contact made by the seal of the carrier against the wafer. Additionally, the current may be used to characterize the openings on the top layer of the wafer as the wafer is rotated.

Figure 4B:
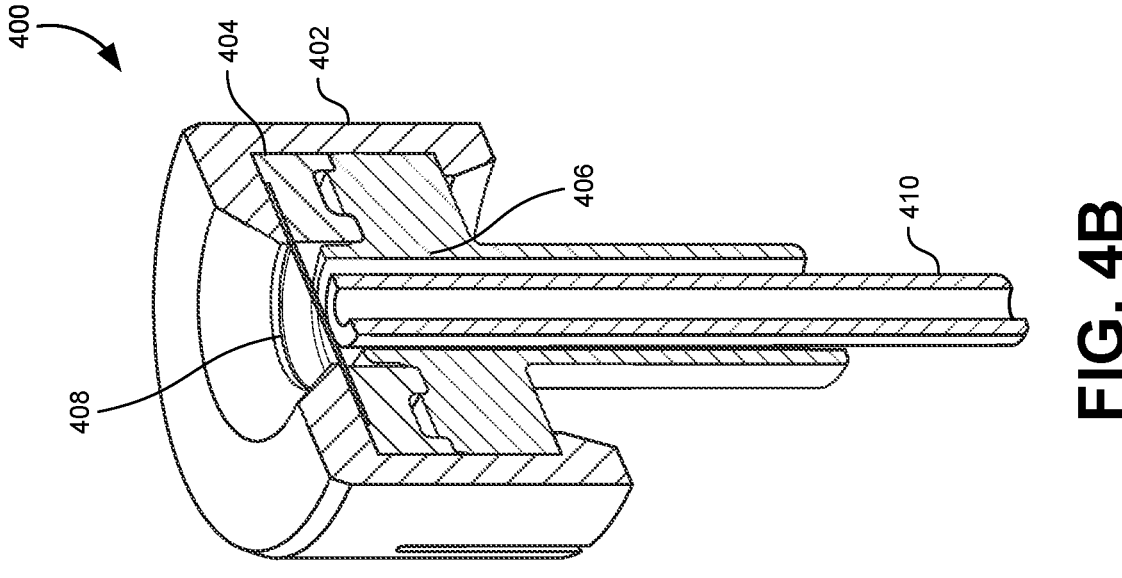
FIGS. 4A-4B illustrate an electrode, according to some embodiments.
Figure 4A:
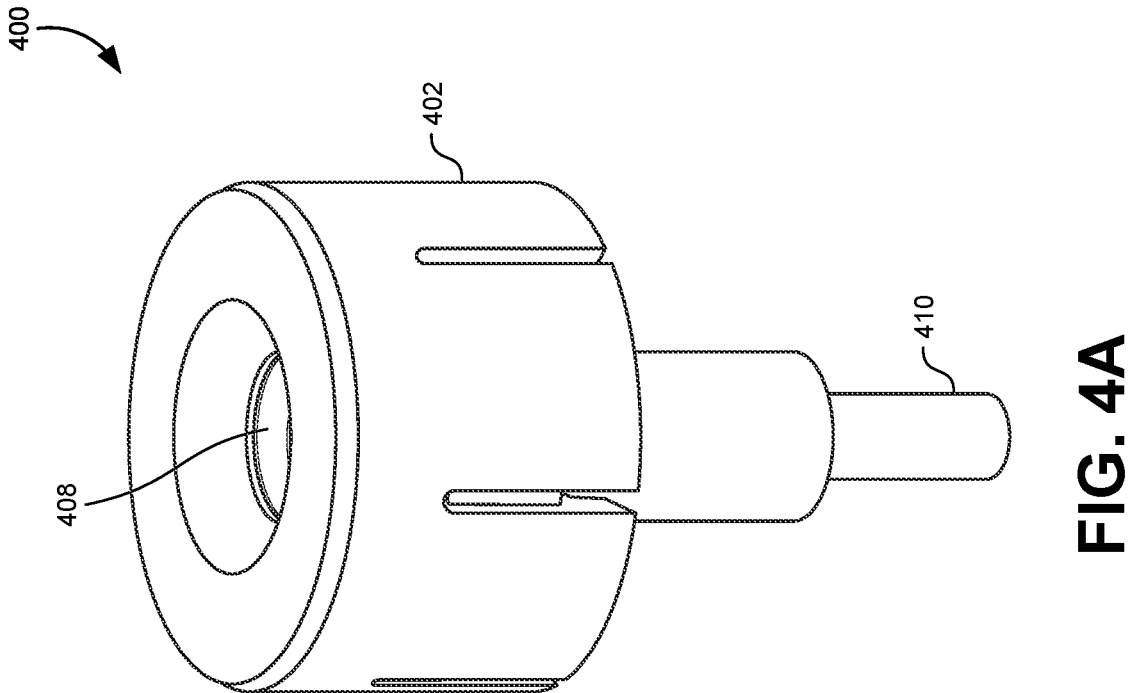

FIGS. 4A-4B illustrate an electrode 400, according to some embodiments. This electrode 400 may be separate and distinct from the thief electrodes that are part of the weir assembly of the plating chamber described above. Note that the electrode 400 is provided only by way of example and is not meant to be limiting. Any type of electrode may be used. However, the electrode 400 may provide certain advantages in some plating chamber environments.

Typically, the anodes used in a plating chamber are consumable anodes that include large volumes of copper on top of platinized plates to provide metal for the plating process. For example, a copper anode may provide copper that flows through the electrolyte and is deposited on the wafer acting as a cathode during an electroplating process, and the copper is thereby "consumed" during the process. In some embodiments, the electrode 400 may be inert and need not include any consumable material, such as copper. For example, the thief electrodes in the weir assembly may also be inert electrodes that steal current from the plating process to increase or decrease the plating current at certain locations on the wafer. Instead of stealing current from the plating process, this electrode 400 may be primarily configured to flow a current from the electrode to the wafer in order to characterize the wafer rather than to deposit a plating material.

The design of the electrode 400 may allow the electrode 400 to be readily inserted and removed from a corresponding socket in the plating chamber. The electrode 400 may include a molded or machined housing that includes a cap 402. The cap 402 may be formed from an injection molding PVDF process, and may be configured to "click" over the head of the electrode 400 using flexible barbs that engage underneath the head of the electrode 400. The cap 402 may protect the head of the electrode while exposing a membrane 408 for the current to flow from the electrode 400. A molded seal 404, such as an FKM synthetic rubber gasket may be used to seal against the cap 402. The molded seal 404 may surround the electrode 406. The electrode 406 may include a titanium electrode with an MMO-coated surface to form an anode. A stem 410 may extend down from the electrode 406 to form electrical contact when connected to a corresponding socket in the plating chamber.

The electrode 400 may be inserted into a socket with a corresponding shape in the housing of the plating chamber. Rubber gaskets in the housing may be present in the socket around the electrode 400 to keep the liquid electrolyte from entering the socket. The electrode 400 may be pressed-fitted into the socket such that the stem 410 mates with a corresponding electrical connection in the housing of the plating chamber. The electrical connection in the housing of the plating chamber may be routed to a controller that provides power for the electrode. In some embodiments, the top of the cap 402 may sit flush with the housing of the plating chamber.

Figure 5:
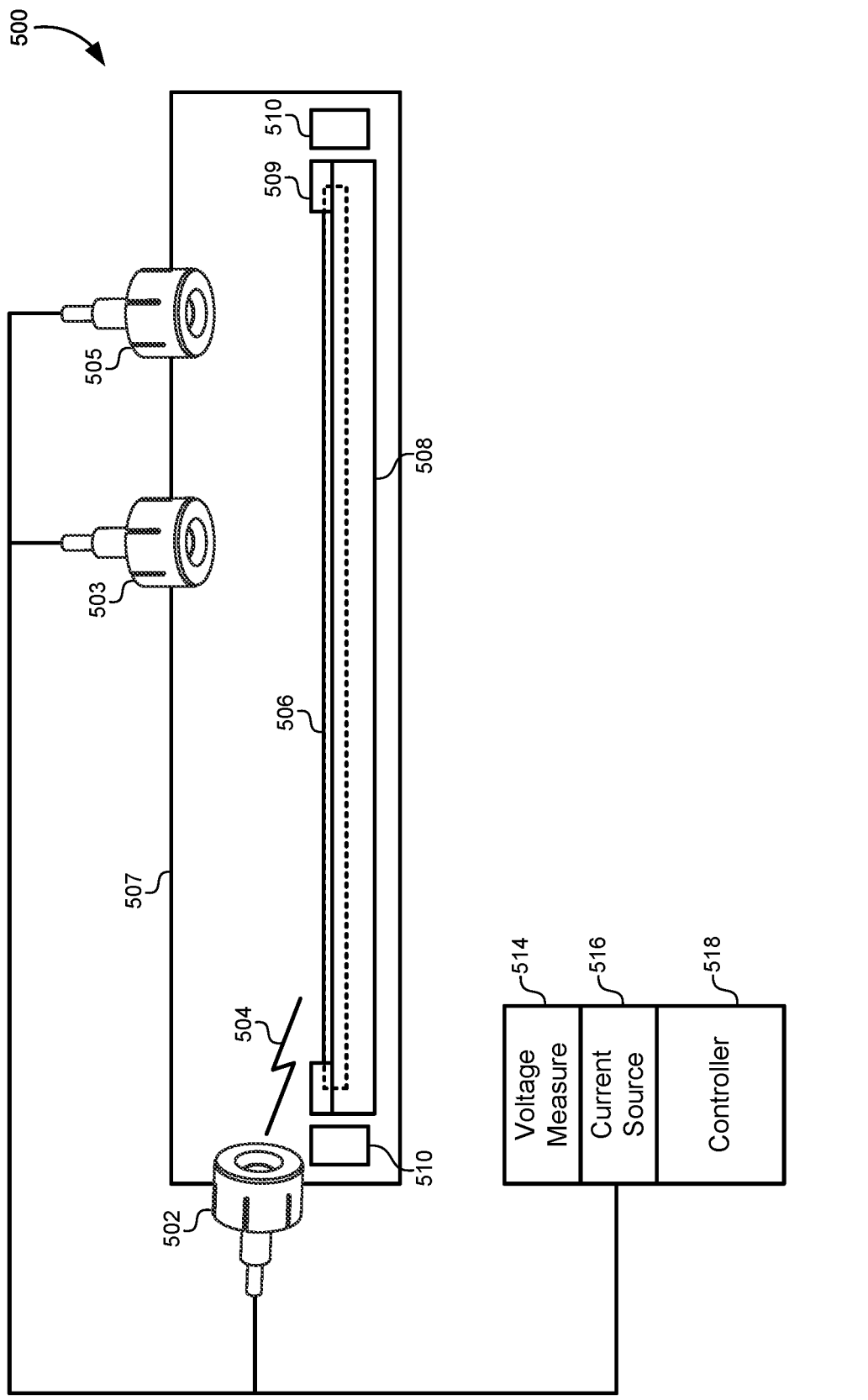
FIG. 5 illustrates a configuration of a semiconductor plating chamber, according to some embodiments.

FIG. 5 illustrates a configuration of a semiconductor plating system 500, according to some embodiments. The semiconductor plating system 500 may represent a portion of the electroplating system 20 described above in FIG. 1. The semiconductor plating system 500 may include a vessel assembly 507 for holding an electrolyte and a wafer 506. The wafer 506 may be enclosed in a carrier 508. The carrier 508 may cover a bottom side of the wafer 506 and may include a seal 509 that covers a periphery of a top side of the wafer 506. For example, in FIG. 5 the wafer 506 may be placed in the carrier 508, and the seal 509 may be placed on top of the carrier 508 and the wafer 506 to hold the wafer 506 in place. The seal 509 may form a liquid-tight seal against the wafer 506 to prevent the plating bath or liquid electrolyte from entering into the carrier 508 while still exposing the top surface of the wafer 506 to the plating process.

In order to facilitate the plating operation, the top side of the wafer 506 may include a seed layer. The seed layer may provide a conductive layer on the top of the wafer 506 to act as a cathode in the plating chamber. As current passes through the copper anodes to the cathode of the seed layer, the copper metal will plate on top of the seed layer. The seal 509 may include electrical contacts that are electrically coupled to a portion of the seed layer on the top of the wafer 506 that extends underneath the seal 509. Current from the anodes in the plating chamber may travel through the electrolyte, into the seed layer, and then into the electrical contacts of the seal 509.

During the plating process, the carrier 508 may rotate in the electrolyte as the plating bath is agitated by the paddles as described above to fully cover the top surface of the wafer 506 and fill any openings in a mask layer with the liquid. As the carrier 508 rotates, the plurality of thief electrodes 510 may steal current from the plating process that would otherwise cause metal to be plated on the surface of the wafer 506. This allows the thief electrodes 510 to reduce the amount of material plated at certain regions around the periphery of the wafer 506 as the wafer rotates. For example, if it is determined using the techniques described below that a sector of the wafer 506 should receive less plating current (e.g., because the sector does not include many open areas), a thief electrode can steal more current as that sector passes by that thief electrode. Conversely, if a sector includes a large open area, the thief electrode may steal less current to increase the amount of current depositing metal on that sector as the sector passes by the thief electrode.

The semiconductor plating system 500 may include one or more electrodes 502, 503, 505 that are placed around the wafer 506 in the vessel assembly 507. For example, and electrode 502 may be placed near the periphery of the wafer 506 as the wafer 506 rotates in the vessel assembly 507. This allows electrode 502 to flow current to the edge of the wafer 506 and characterize the openings around the edge of the wafer and/or the seal as described in detail below. The electrode 502 may be located at or above the level of the wafer 506, while some embodiments may alternatively place the electrode 502 below the wafer 506 in a bottom corner of the vessel assembly 507. In some embodiments, one or more of the electrodes 502, 503, 504 may be integrated into the weir assembly with the standard thief electrodes. For example, some embodiments of the weir assembly may include a point source electrode that may be used to perform the mapping analysis described below.

Any number of electrodes may be used, and the three electrodes 502, 503, 505 illustrated in FIG. 5 are not meant to be limiting in their number or their placement. For example, a single electrode 502 may be used in some embodiments at the periphery of the wafer 506. Other embodiments may additionally or alternatively place electrodes at various radial locations above the wafer 506. For example, electrode 503 and electrode 505 may each be positioned above a respective interior radius of the wafer. This may allow the semiconductor plating system 500 to characterize the openings on the wafer at different radii on the surface of the wafer 506.

The semiconductor plating system 500 may include a controller 518. The controller 518 may be implemented by a microprocessor, a microcontroller, a computer system, an embedded controller, a remote computer system, and/or any other computerized controller. For example, the computer system 1000 illustrated below in FIG. 10 may implement the controller 518. The controller 518 may include one or more processors and one or more memory devices. The memory device(s) may store instructions that cause the one or more processors to perform the operations described below to control current flowing through the electrodes 502, 503, 505 and/or measure electrical characteristics of this current.

The controller 518 may be configured or programmed to cause a current to flow from, for example, the electrode 502 in the vessel assembly 507 through the electrolyte and into the conductive layer on the surface of the wafer 506. Some embodiments may use a current source 516 to supply a constant current to the electrode 502. This constant current 504 may then pass through the electrolyte into the surface of the wafer. The controller 518 may also cause a voltage circuit 514 to measure or record a voltage required to drive the constant current from the current source 516. Voltage measurements may be recorded in real time as a time-series of voltage measurements as the constant current 504 is driven through the electrode 502. In some embodiments, the controller 518 may be an integrated controller that includes the current source 516 and the voltage circuit 514. For example, the applied voltage and/or current may be a function of a single power supply within the controller 518. The power supply may supply the current and provide a measurement of the voltage required to drive the current.

The electrodes 502, 503, 504 may operate either as cathode or anode electrodes, depending on the polarity of the controller 518. For example, the controller 518 may include positive (+) and negative (−) connections that complete the circuit between the electrode 502 and the seal 509. Reversing the polarity of the voltage/current applied to the electrode 502 may allow the electrode to act either as an anode or a cathode (e.g., an extra thief electrode).

Note that providing a constant current 504 and measuring the voltage required to drive the constant current 504 represents only one technique among many for operating the electrode 502. More generally, the controller 518 may cause a current to flow from the electrode to the wafer in the plating chamber. While the current flows, the controller 518 may cause measurements to be recorded for an electrical characteristic associated with the current. This electrical characteristic may be a resistance, a voltage, a current, and/or any other electrical characteristic. For example, a constant voltage may be provided and the resulting current through the electrolyte may be recorded.

This process of providing a current 504 through the electrode 502 and measuring the voltage required to drive the current 504 may be performed during a live electroplating process. Alternatively, the process of providing a current 504 through the electrode 502 may be performed during a special process used to characterize the wafer 506 and/or the electrical contacts of the seal 509.

Figure 6:
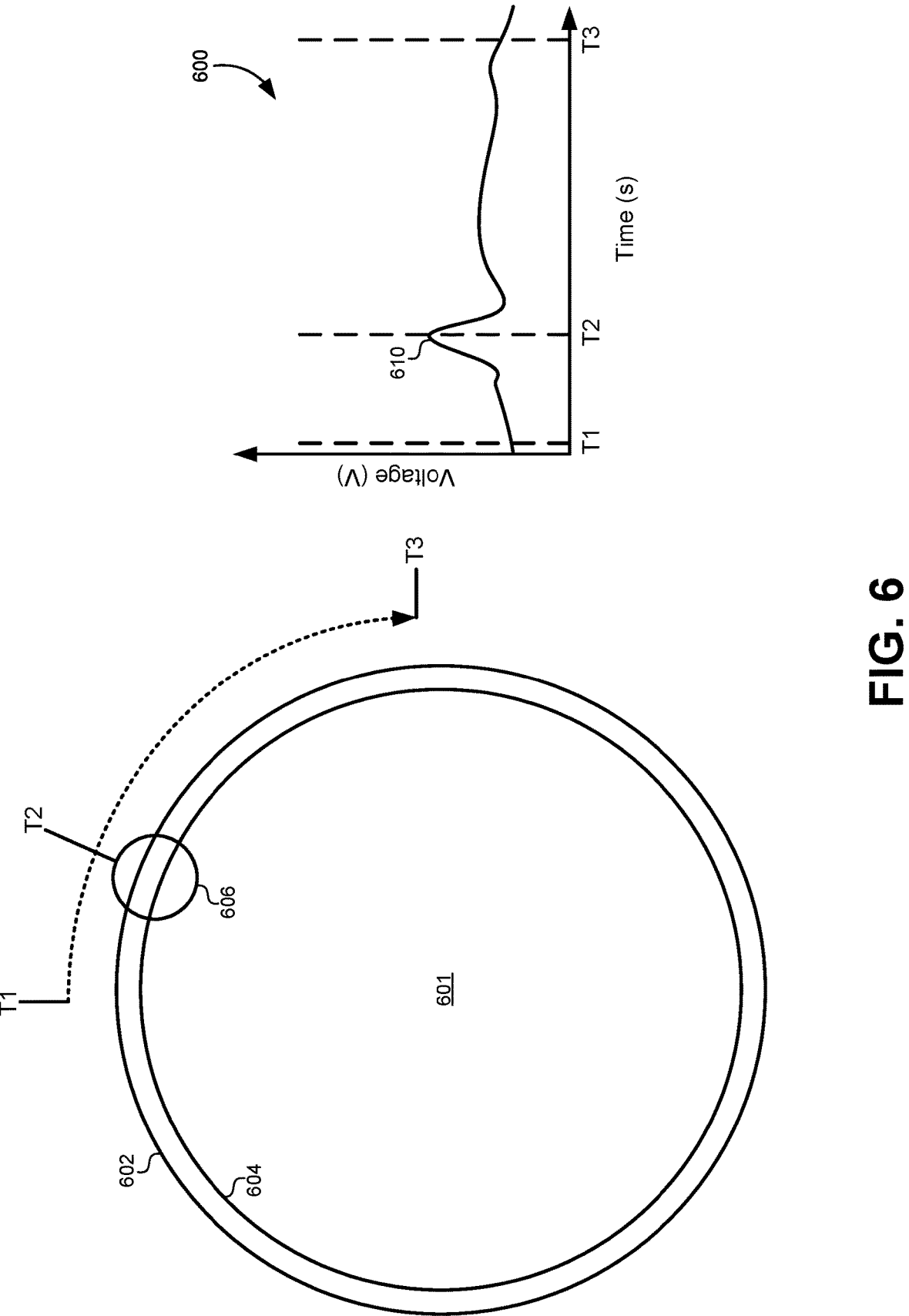
FIG. 6 illustrates how an electrical characteristic may be measured to characterize how well the seal is electrically coupled to the conductive layer on the wafer, according to some embodiments.

FIG. 6 illustrates how an electrical characteristic may be measured to characterize how well the seal is electrically coupled to the conductive layer on the wafer, according to some embodiments. FIG. 6 illustrates a top view of a wafer 601 in a carrier 602. The seal 604 of the carrier 602 is shown covering a peripheral portion of the top of the wafer 601. In order to characterize the electrical contact made by the seal 604, the wafer 601 may be provided with a uniform blanket seed layer present on the surface of the wafer 601. For example, the seed layer may be formed on the wafer 601 without forming a patterned mask layer over the seed layer. The wafer 601 may then be rotated in the plating chamber and the electrode may be used to pass a low forward current into the seed layer on the wafer 601.

The partial rotation of the wafer 601 is illustrated in FIG. 6 between a location measured at time Ti and a location measured at time T3. By way of example, a fixed forward current may be passed through the electrode, and an electrical characteristic such as a voltage required to drive the fixed forward current may be measured and recorded as a time series of values during the rotation. The graph 600 illustrates an example of voltage measurements recorded as a function of time. Based on the known rotational speed of the wafer, each time increment may be used to calculate a corresponding location or angular rotation of the wafer.

Therefore, time and location on the wafer may be interchangeable in any embodiments.

In this example, a variation in the voltage response may indicate a variation in the cathodic portion of the circuit. A voltage variation may be caused by a variation in the contact resistance between the seal 604 and the seed layer on the wafer 601. As a seal begins to age or weaken, the electrical coupling between the electrical contacts on the seal 604 and the wafer 601 may begin to degrade. For example, as the seal begins the age, the electrical contacts may not be pressed is firmly against the seed layer, or corrosion may begin to build up on the electrical contacts. The voltage curve in the graph 600 may be referred to herein as a "ring map" that characterizes how well the seal is electrically coupled to the conductive layer on the wafer around the periphery of the wafer. Specifically, this characterization may be based on the electrical characteristic (e.g., the voltage measured) of the current flowing from the electrode.

In FIG. 6, the seal 604 may include a location 606 where the electrical contact between the seal 604 and the wafer 601 is compromised. This location 606 is indicated in the graph 600 by voltage peak 610. As the contact weakens, the contact resistance increases. The increased contact resistance requires a higher voltage in order to drive the same amount of current through the contact. This illustrates how the graph 600 characterizes how well the seal is electrically coupled to the conductive layer on the wafer, with peaks in the voltage curve indicating areas where the seal 604 may be failing.

Since the carrier 602 and the seal 604 may be reused repeatedly on many different wafers, the process described above may be used to characterize the seal 604 independently from any pattern on the wafer. Therefore, this process may use a uniform seed layer or uniform conductive layer without any openings. For example, a blank wafer with uniform seed layer may be loaded into the plating chamber and rotated in order to characterize the seal (e.g., the uniform seed layer may be the top-most layer on the wafer without a mask layer on top of the uniform seed layer). Afterwards, the carrier 602 may be loaded with patterned wafers to undergo a plating process as part of device manufacturing process. This characterization of the seal may then be used in combination with a characterization of the wafer to control or adjust the amount of current stolen by the thief electrodes in the weir assembly. Alternatively, this characterization may be used to evaluate the quality of the seal over its lifetime. For example, the graph characterizing how well the seal is electrically coupled to a conductive layer on the wafer may be used to identify an aging seal 604 and to determine when the seal 604 and/or carrier 602 should be replaced.

Figure 7:
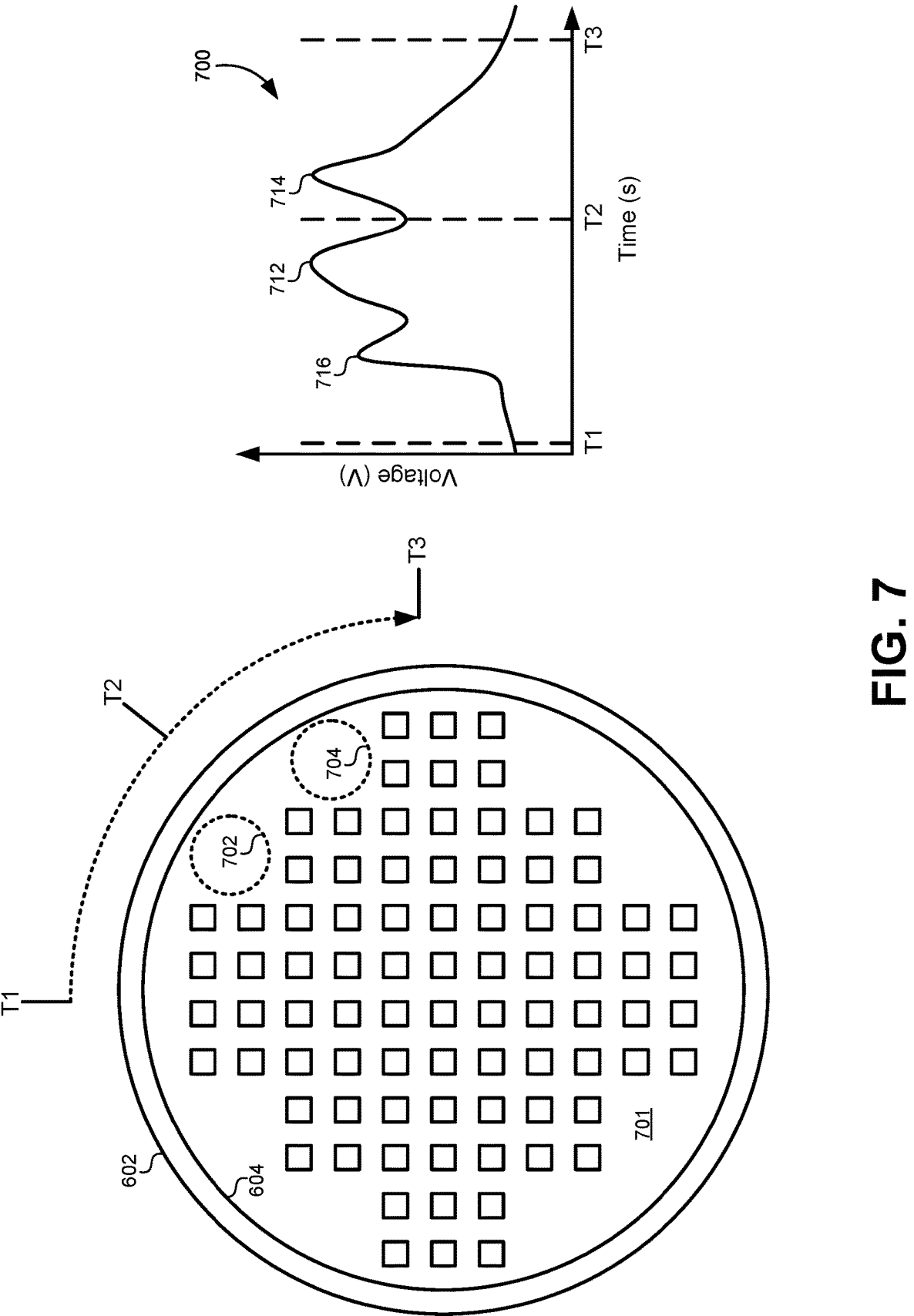
FIG. 7 illustrates how an electrical characteristic may be measured to characterize the openings in the top layer of the wafer, according to some embodiments.

FIG. 7 illustrates how an electrical characteristic may be measured to characterize the openings in the top layer of the wafer, according to some embodiments. The carrier 602 may be loaded with a patterned wafer 701 and secured using the seal 604. A patterned wafer 701 may include a mask layer or pattern layer as a top-most layer on the wafer. For example, a layer of photoresist may be deposited on the surface of the patterned wafer 701. A pattern may then be etched into the photoresist using various lithography techniques. The pattern may include openings that expose the uniform seed layer underneath the mask layer to the plating process.

Note that the pattern of openings illustrated on the patterned wafer 701 in FIG. 7 is greatly simplified and provided only by way of example. Actual wafers will typically include very complicated patterns. However, the simplification of the patterned wafer 701 illustrates some of the difficulties in uniformly plating openings in the mask layer. For example, a space is typically provided between the seal 604 and the openings on the patterned wafer 701 to prevent liquid from penetrating under the seal through the openings. The space between the openings and the seal 604 may not be uniform due to the size of the dies on the patterned wafer 701 and/or other layout constraints. This creates areas where the openings are more dense near the periphery of the patterned wafer 701 (i.e., a larger percentage of the seed layer exposed via openings in the mask layer). This also creates areas where the openings are less dense and more sparse near the periphery of the patterned wafer 701 (i.e., a smaller percentage of the seed layer is exposed via openings in the mask layer). FIG. 7 illustrates a location 702 and a location 704 where the openings are less dense and more sparse near the periphery of the patterned wafer 701 compared to other areas near the periphery of the patterned wafer 701.

This nonuniformity in the openings of the patterned wafer 701 can cause variations in the thickness of the material plated in these openings. In areas such as location 702 where the openings are less dense, the current tends to pool and be funneled into the adjacent openings around the location 702. Therefore, openings in the mask layer that are surrounded by a large mask area tend to receive more current and plate thicker than other locations where the openings are more densely populated. To prevent this from occurring, the current stolen by a thief electrode may be increased as location 702 is rotated next to the thief electrode. Conversely, as the more densely populated areas of the patterned wafer 701 are rotated past the thief electrode, the amount of current stolen may be reduced to provide more plating current to the open areas.

In order to determine where to increase and decrease the current stolen by the thief electrodes, some embodiments may use the additional electrode to characterize the openings in the top layer of the patterned wafer 701 based on the measured electrical characteristic of the current passed through the electrode. For example, a graph 700 may include a characterization of the openings in the top layer represented by the measured voltage required to drive the constant current through the electrode as the patterned wafer 701 is rotated. As location 702 and location 704 are rotated past the electrode, the voltage curve in the graph 700 may include voltage peak 712 and voltage peak 714, respectively. The increased voltage in these peaks corresponds to areas where the openings are less dense, indicating that more voltage was required to drive the current further through the electrolyte to reach an opening in the patterned wafer 701. Conversely, voltage minimums or voltage that is closer to a baseline voltage may represent areas where the openings are more densely populated in the patterned wafer 701.

In addition to the voltage peaks 712 and 714 characterizing the openings in the top layer of the patterned wafer 701, the graph 700 also includes a peak 716 that may be caused by the seal contacts described above in FIG. 6. For example, location 606 may generate a voltage peak at this location for every wafer that subsequently uses the carrier 602 and the seal 604. Therefore, when adding the patterned wafer 701 to the carrier 602, the resulting graph 700 may include voltage variations that correspond to both the seal contacts and the openings in the mask layer.

This process may be carried out at the beginning of the plating process before material is added in a significant amount to the patterned wafer 701. For example, a first 5, 10, 15, 20, etc., rotations of the patterned wafer may be used to characterize the wafer and generate the voltage measurements of graph 700. This mapping may then be used to control or adjust the current stolen by the thief electrodes during the remainder of the plating process. This represents a technical improvement over other contemplated techniques for controlling the current stolen by the thief electrodes. For example, instead of plating an entire wafer, measuring the film thickness of the plated regions, and then adjusting the current stealing when plating subsequent wafers, this process may characterize the openings for a current wafer and use these measurements to plate the current wafer. This minimizes wafer waste and allows each wafer to be characterized individually. This also saves the time that would otherwise be required to completely plate and measure the film thickness on a test wafer.

The current stolen by the thief electrodes may be controlled by the voltage curve in graph 700 that characterizes the openings in the top layer based on the measured electrical characteristic of the current (e.g., the required voltage). For example, the current stolen may be inversely proportional to the measured voltage. Voltage peaks may indicate locations where the thief electrodes should steal more current. This prevents current from pooling on the mask layer and being funneled disproportionately into the neighboring openings. Conversely, voltage minimums or baseline voltages may indicate locations where the thief electrodes should steal less current. This allows more current to be funneled into the dense opening areas to provide additional plating material to the areas.

Figure 8:
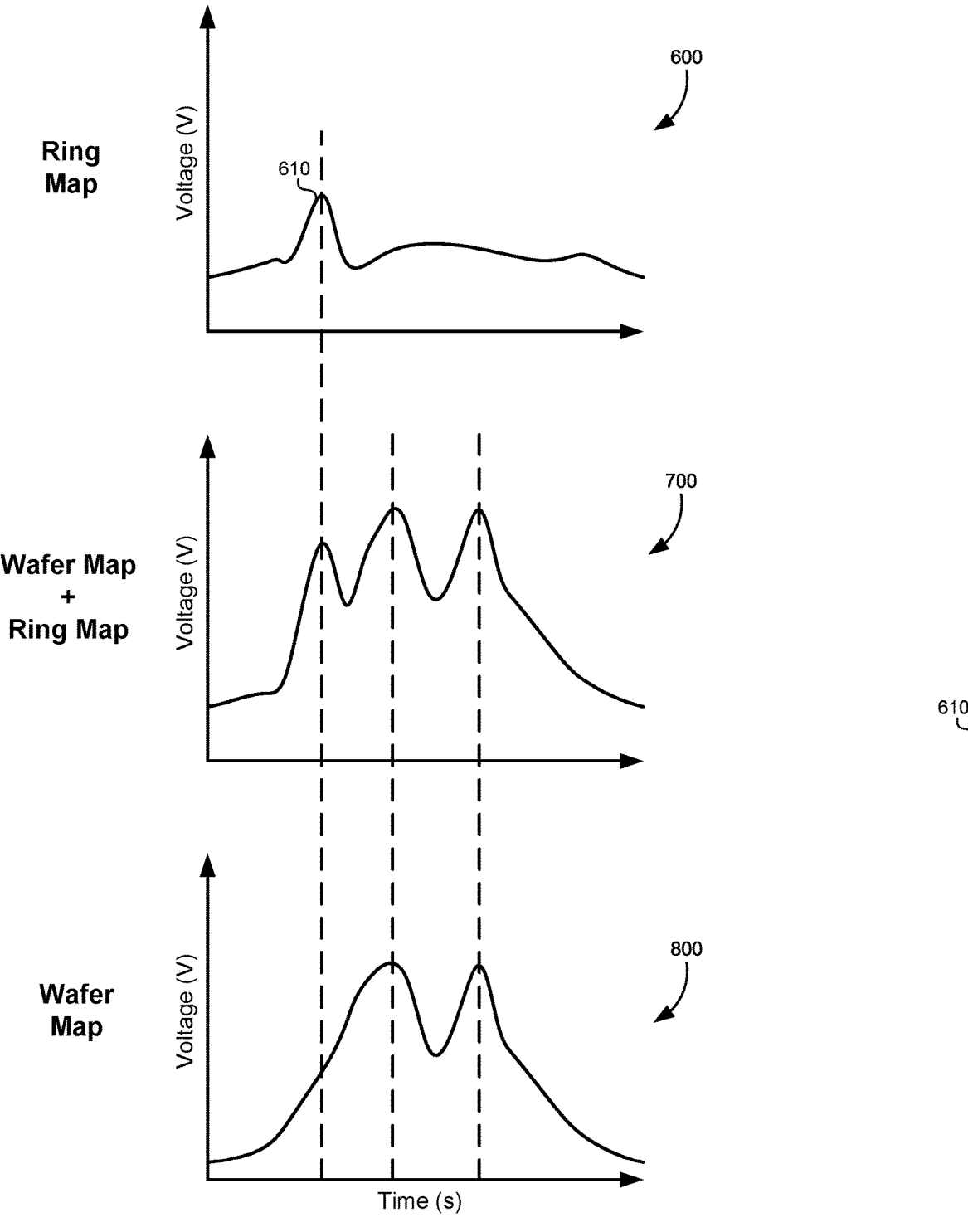
FIG. 8 illustrates how the characterization of the seal may be combined with the characterization of the openings to generate a mapping of the wafer, according to some embodiments.

FIG. 8 illustrates how the characterization of the seal may be combined with the characterization of the openings to generate a mapping of the wafer, according to some embodiments. Some embodiments may use the ring map generated in FIG. 6 to extract a wafer map from the graph 700 in FIG. 7. The graph 700 represents a combination of the effects of the seal and the openings on the patterned wafer. The graph 600 represents only the effect of the seal. The voltage measurements of the ring map from graph 600 may be subtracted from the voltage measurements in graph 700 to generate a set of voltage measurements that represent primarily the effect of the openings on the patterned wafer. These voltage measurements are represented in graph 800, and this characterization may be referred to as a "wafer map." Note that the voltage peak 610 attributed to the seal has been removed from the wafer mapping of the graph 800.

The wafer map and the ring map may be used for various purposes and processes in the semiconductor fabrication process. For example, the controller may adjust the current stolen by the thief electrodes using the combined wafer map and ring map of graph 700 in some embodiments. Alternatively, the controller may adjust the current stolen by the thief electrodes using only the wafer map of graph 800.

In some embodiments, wafers may be used to generate multiple wafer and ring maps similar to graph 700. For example, patterned wafers are usually processed in batches, where each wafer uses the same pattern and is loaded into the carrier at the same orientation. Therefore, it is expected that each of the wafer and ring maps measured while plating these wafers in the batch should be approximately identical. As variations begin to appear in the combined wafer and ring map of graph 700 between wafers, this may indicate variations that may be attributed to the plating chamber itself rather than the wafer. For example, these variations may indicate that the seal or carrier is beginning to age, degrade, and/or fail. Alternatively, these variations may indicate a change in the resistivity of the electrolyte, which may indicate a need to flush or cycle the electrolyte more often or at a different flow rate. These are only two examples of the many different variations in the plating chamber environment or hardware that may cause a variation in the wafer and ring map.

Figure 9:
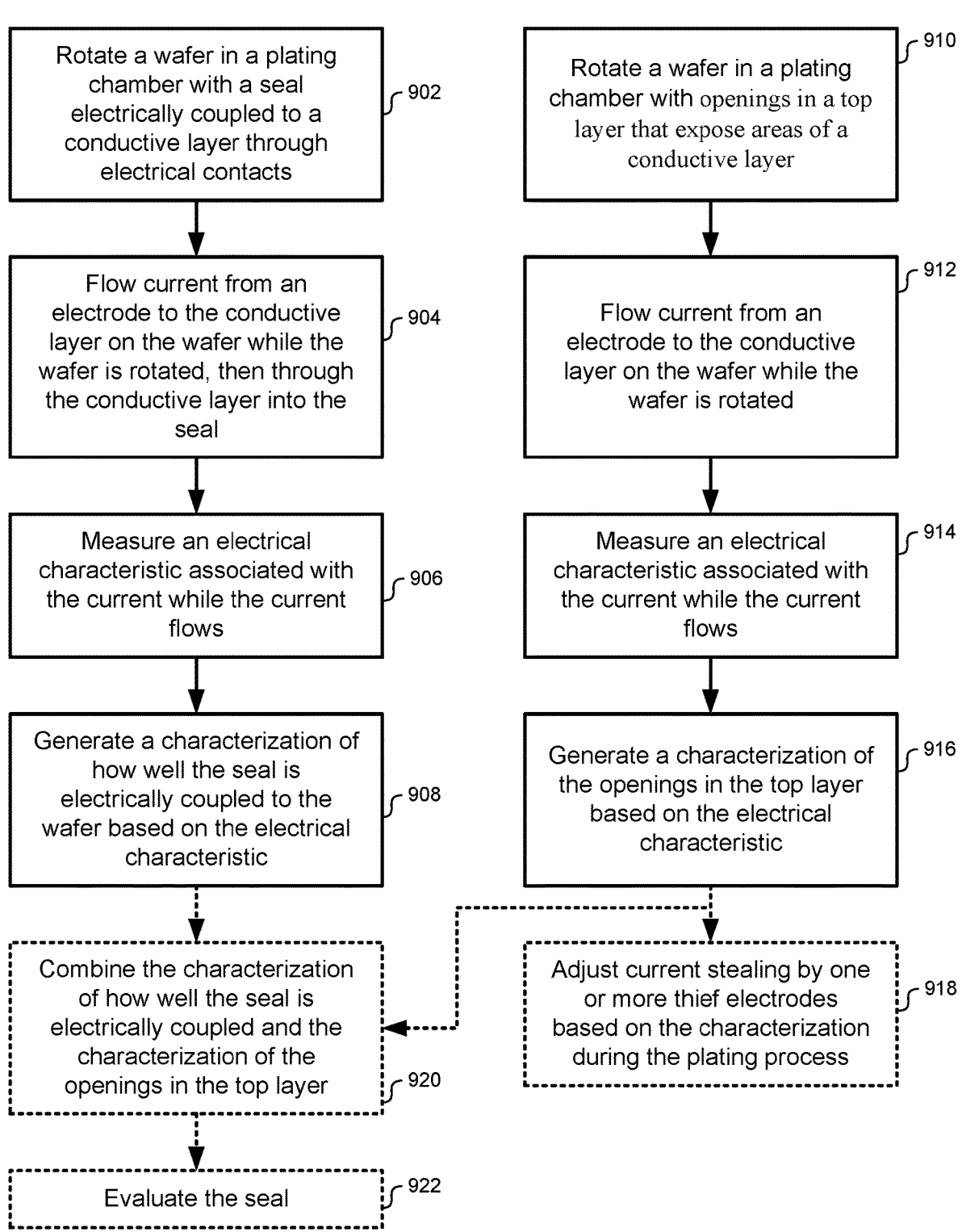
FIG. 9 illustrates a flowchart of a method for characterizing wafers and/or seals around wafers during plating processes, according to some embodiments.

FIG. 9 illustrates a flowchart of a method for characterizing wafers and/or seals around wafers during plating processes, according to some embodiments. This flowchart represents two sub-methods that may be executed together or independently. The first sub-method may include causing a wafer to be rotated in a plating chamber (902). The wafer may be enclosed in a carrier that forms a seal around the periphery of the wafer. The seal may be electrically coupled to a conductive layer on the wafer through electrical contacts inside the seal. For example, the seal may form an electrical contact with a uniform seed layer. The uniform seed layer may extend underneath the seal, and this uniform seed layer may represent the topmost layer on the wafer without a mask layer covering portions of the seed layer.

The method may also include causing current to flow from an electrode in the plating chamber to the conductive layer on the wafer while the wafer is being rotated (904). The wafer may be submerged in an electrolyte or a plating bath and rotated next to an electrode. Note that this electrode may represent an additional node electrode in the chamber that is separate and distinct from the thief electrodes in the weir assembly that steal current during the plating process to regulate the film thickness. Instead, this node electrode may be used primarily to pass current to the wafer and measure an electrical characteristic to characterize the wafer and/or the seal. Thus, the electrode may not part of the weir thief electrode assembly and may instead be inserted into a socket in the housing of the plating chamber or vessel assembly in some embodiments. The electrode may be located such that the electrode and the wafer are submerged in an electrolyte or other plating bath during the plating process, thereby causing the current to flow from the electrode to the wafer through the electrolyte. The current may include a constant current that is driven from a current source. Alternatively, a variable current may be driven from a constant voltage source.

The method may additionally include causing an electrical characteristic associated with the current to be measured while the current flows from the electrode to the conductive layer (906). For example, the electrical characteristic may include a voltage required to drive a constant current through the electrode. Alternatively, the electrical characteristic may also include a current driven by a constant voltage source. This current may be driven and the characteristic may be measured during a first portion of the plating process, such as a first 5, 10, 15, 20, and so forth, rotations of the wafer in the plating chamber. After this characterizing portion of the process, the electrode may be turned off to avoid interfering with the remainder of the plating process. Other embodiments may continuously flow current and characterize wafer throughout the plating process.

The method may further include generating a characterization of how well the seal is electrically coupled to the conductive layer on the wafer around the periphery of the wafer based on the electrical characteristic (908). The characterization may include a map of voltages corresponding to locations around the periphery of the wafer. Higher voltage measurements may represent areas where the seal is not sufficiently electrically coupled to the conductive layer through the electrical contacts inside the seal. Higher voltages may also represent areas where the electrical contacts are corroded or otherwise have an increased contact resistance. This resulting characterization may include a time-series of voltage measurements as shown in the graphs discussed above. This characterization may be referred to as a ring map and used to characterize the seal for a batch of wafers that all use the same carrier and/or seal.

The second sub-method may be used to characterize wafers during the plating process. For example, electrical characteristics may be measured to characterize the openings in the top layer of a patterned wafer. The second sub-method may be carried out after first sub-method described above to generate the ring map. Alternatively, this second sub-method may be carried out entirely independently from the first sub-method. For example, some embodiments may skip the first sub-method entirely without characterizing the ring map at all.

This method may include causing a wafer to be rotated in a plating chamber (910). The wafer may be a patterned wafer. For example, a mask layer of photoresist may be formed over a conductive seed layer, and openings may be formed in the mask layer to expose portions of the seed layer. The patterned wafer may be submerged in a plating liquid that also covers the electrode. The wafer may then be rotated in the plating liquid to characterize the openings around the periphery of the wafer. An initial number of rotations may be used to characterize the wafer, followed by a larger number of rotations during the actual plating process.

The method may also include causing current to flow from an electrode in the plating chamber to the conductive layer on the wafer while the wafer is being rotated (912). For example, a constant current source may be used to drive the electrode as described above. The current from the electrode may enter the wafer through the openings in the mask layer through the exposed conductive seed layer. The current may then pass through the seed layer into the seal as described above.

The method may additionally include causing an electrical characteristic associated with the current to be measured while the current flows from the electrode to the conductive layer (914). For example, the electrical characteristic may include a voltage required to drive a constant current through the electrode into the openings of the rotating wafer. Other characteristics may also be measured.

The method may further include generating a characterization of the openings in the top layer based on the electrical characteristic (916). This characterization may include a time-series sequence of voltage measurements that may be correlated with locations on the wafer and/or angular rotations of the wafer. For example, higher voltages may represent locations where openings in the top layer or mask layer are most sparse, requiring more voltage to drive the current further into the openings that are farther away from the periphery of the wafer.

Some embodiments may optionally adjust an amount of current stolen by one or more thief electrodes based on the characterization of the openings in the top layer (918). For example, based on the characterization generated above (e.g., the voltage map), the controller may cause one or more thief electrodes to steal more current at locations on the wafer where the openings in the top layer are most sparse near the periphery of the wafer. Conversely, the controller may cause one or more thief electrodes to steal less current at locations on the wafer where the openings in the top layer are most dense near the periphery of the wafer.

Some embodiments may optionally combine (a) the characterization of how well the seal is electrically coupled to the conductive layer and (b) the characterization of the openings in the top layer of a patterned wafer to generate a mapping of the wafer (920). For example, the ring map may be subtracted from the ring and wafer map generate a wafer map. Variations in the wafer map over time and across a number of different wafers having the same pattern may be used to characterize the quality of the seal (922). If variations in the wafer map for the same patterned wafer are observed over time, this may indicate a change in the quality of the seal and/or the quality of the electrical coupling of the contacts in the seal as described above.

It should be appreciated that the specific steps illustrated in FIG. 9 provide particular methods of characterizing seals and/or wafers in plating processes according to various embodiments. Other sequences of steps may also be performed according to alternative embodiments. For example, alternative embodiments may perform the steps outlined above in a different order. Moreover, the individual steps illustrated in FIG. 9 may include multiple sub-steps that may be performed in various sequences. Furthermore, additional steps may be added or removed depending on the particular applications. Many variations, modifications, and alternatives also fall within the scope of this disclosure.

Each of the methods described herein may be implemented by a computer system. Each step of these methods may be executed automatically by the computer system, and/or may be provided with inputs/outputs involving a user. For example, a user may provide inputs for each step in a method, and each of these inputs may be in response to a specific output requesting such an input, wherein the output is generated by the computer system. Each input may be received in response to a corresponding requesting output. Furthermore, inputs may be received from a user, from another computer system as a data stream, retrieved from a memory location, retrieved over a network, requested from a web service, and/or the like. Likewise, outputs may be provided to a user, to another computer system as a data stream, saved in a memory location, sent over a network, provided to a web service, and/or the like. In short, each step of the methods described herein may be performed by a computer system, and may involve any number of inputs, outputs, and/or requests to and from the computer system which may or may not involve a user. Those steps not involving a user may be said to be performed automatically by the computer system without human intervention. Therefore, it will be understood in light of this disclosure, that each step of each method described herein may be altered to include an input and output to and from a user, or may be done automatically by a computer system without human intervention where any determinations are made by a processor. Furthermore, some embodiments of each of the methods described herein may be implemented as a set of instructions stored on a tangible, non-transitory storage medium to form a tangible software product.

Figure 10:
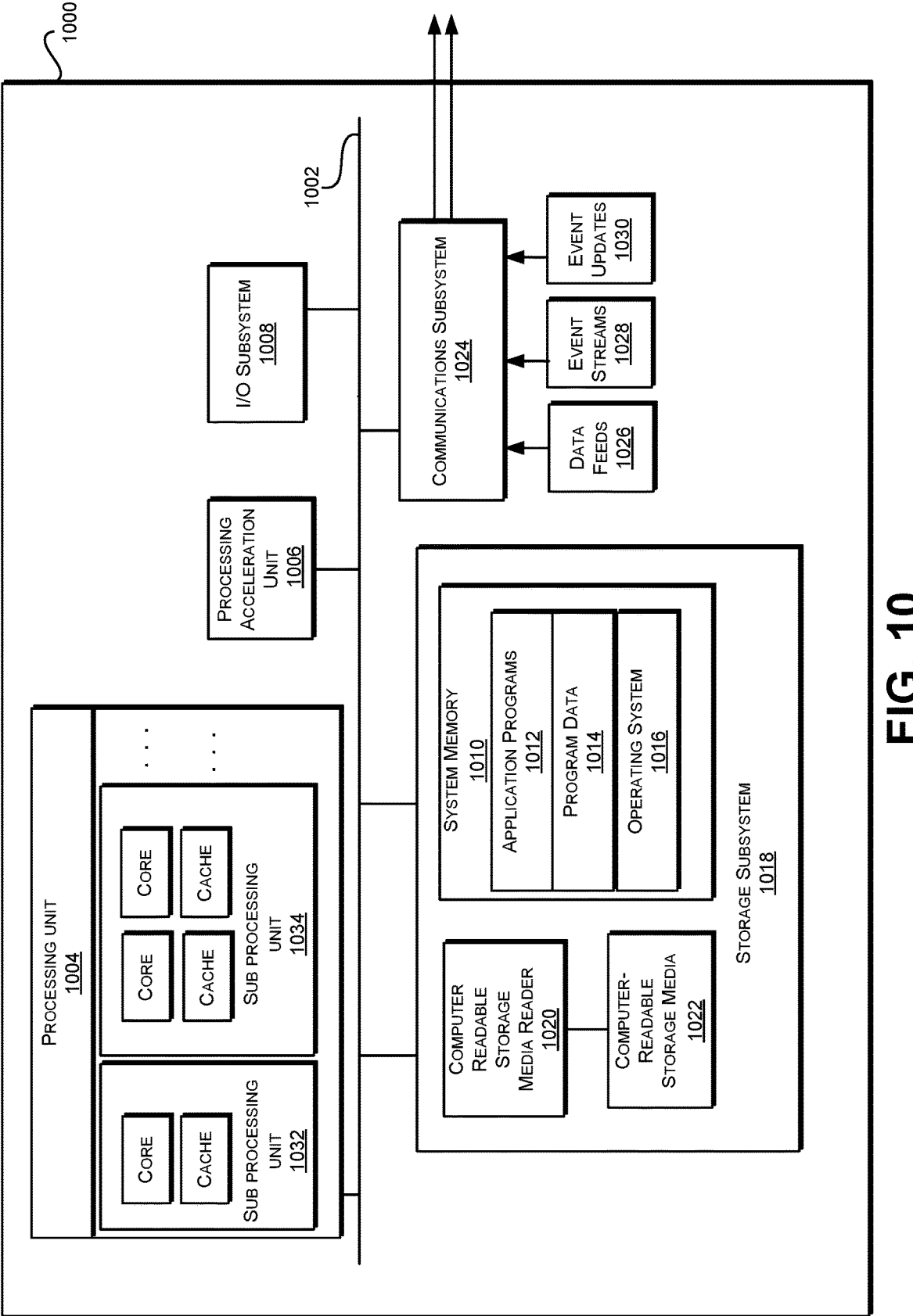
FIG. 10 illustrates an exemplary computer system, in which various embodiments may be implemented.

FIG. 10 illustrates an exemplary computer system 1000, in which various embodiments may be implemented. The system 1000 may be used to implement any of the computer systems described above. For example, the computer system 1000 may be used to implement the controller 518 of the semiconductor plating system 500 described above. As shown in the figure, computer system 1000 includes a processing unit 1004 that communicates with a number of peripheral subsystems via a bus subsystem 1002. These peripheral subsystems may include a processing acceleration unit 1006, an I/O subsystem 1008, a storage subsystem 1018 and a communications subsystem 1024. Storage subsystem 1018 includes tangible computer-readable storage media 1022 and a system memory 1010.

Bus subsystem 1002 provides a mechanism for letting the various components and subsystems of computer system 1000 communicate with each other as intended. Although bus subsystem 1002 is shown schematically as a single bus, alternative embodiments of the bus subsystem may utilize multiple buses. Bus subsystem 1002 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 1004, which can be implemented as one or more integrated circuits (e.g., a conventional micropro- cessor or microcontroller), controls the operation of com- puter system 1000. One or more processors may be included in processing unit 1004. These processors may include single core or multicore processors. In certain embodiments, processing unit 1004 may be implemented as one or more independent processing units 1032 and/or 1034 with single or multicore processors included in each processing unit. In other embodiments, processing unit 1004 may also be implemented as a quad-core processing unit formed by integrating two dual-core processors into a single chip.

In various embodiments, processing unit 1004 can execute a variety of programs in response to program code and can maintain multiple concurrently executing programs or processes. At any given time, some or all of the program code to be executed can be resident in processor(s) 1004 and/or in storage subsystem 1018. Through suitable pro- gramming, processor(s) 1004 can provide various function- alities described above. Computer system 1000 may addi- tionally include a processing acceleration unit 1006, which can include a digital signal processor (DSP), a special- purpose processor, and/or the like.

I/O subsystem 1008 may include user interface input devices and user interface output devices. User interface input devices may include a keyboard, pointing devices such as a mouse or trackball, a touchpad or touch screen incor- porated into a display, a scroll wheel, a click wheel, a dial, a button, a switch, a keypad, audio input devices with voice command recognition systems, microphones, and other types of input devices. User interface input devices may include, for example, motion sensing and/or gesture recog- nition devices such as the Microsoft Kinect® motion sensor that enables users to control and interact with an input device, such as the Microsoft Xbox® 360 game controller, through a natural user interface using gestures and spoken commands. User interface input devices may also include eye gesture recognition devices such as the Google Glass® blink detector that detects eye activity (e.g., 'blinking' while taking pictures and/or making a menu selection) from users and transforms the eye gestures as input into an input device (e.g., Google Glass®). Additionally, user interface input devices may include voice recognition sensing devices that enable users to interact with voice recognition systems (e.g., Siri® navigator), through voice commands.

User interface input devices may also include, without limitation, three dimensional (3D) mice, joysticks or point- ing sticks, gamepads and graphic tablets, and audio/visual devices such as speakers, digital cameras, digital camcord- ers, portable media players, webcams, image scanners, fin- gerprint scanners, barcode reader 3D scanners, 3D printers, laser rangefinders, and eye gaze tracking devices. Addition- ally, user interface input devices may include, for example, medical imaging input devices such as computed tomography, magnetic resonance imaging, position emission tomog- raphy, medical ultrasonography devices. User interface input devices may also include, for example, audio input devices such as MIDI keyboards, digital musical instru- ments and the like.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 1000 to a user or other computer. For example, user interface output devices may include, without limitation, a variety of display devices that visually convey text, graphics and audio/video information such as monitors, printers, speakers, headphones, automo- tive navigation systems, plotters, voice output devices, and modems.

Computer system 1000 may comprise a storage subsys- tem 1018 that comprises software elements, shown as being currently located within a system memory 1010. System memory 1010 may store program instructions that are load- able and executable on processing unit 1004, as well as data generated during the execution of these programs.

Depending on the configuration and type of computer system 1000, system memory 1010 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 1004. In some implemen- tations, system memory 1010 may include multiple different types of memory, such as static random access memory (SRAM) or dynamic random access memory (DRAM). In some implementations, a basic input/output system (BIOS), containing the basic routines that help to transfer informa- tion between elements within computer system 1000, such as during start-up, may typically be stored in the ROM. By way of example, and not limitation, system memory 1010 also illustrates application programs 1012, which may include client applications, Web browsers, mid-tier applica- tions, relational database management systems (RDBMS), etc., program data 1014, and an operating system 1016. By way of example, operating system 1016 may include various versions of Microsoft Windows®, Apple Macintosh®, and/ or Linux operating systems, a variety of commercially- available UNIX® or UNIX-like operating systems (includ- ing without limitation the variety of GNU/Linux operating systems, the Google Chrome® OS, and the like) and/or mobile operating systems such as iOS, Windows® Phone, Android® OS, BlackBerry® 10 OS, and Palm® OS oper- ating systems.

Storage subsystem 1018 may also provide a tangible computer-readable storage medium for storing the basic programming and data constructs that provide the function- ality of some embodiments. Software (programs, code mod- ules, instructions) that when executed by a processor pro- vide the functionality described above may be stored in storage subsystem 1018. These software modules or instruc- tions may be executed by processing unit 1004. Storage subsystem 1018 may also provide a repository for storing data used in accordance with some embodiments.

Storage subsystem 1000 may also include a computer- readable storage media reader 1020 that can further be connected to computer-readable storage media 1022.

Together and, optionally, in combination with system memory 1010, computer-readable storage media 1022 may comprehensively represent remote, local, fixed, and/or removable storage devices plus storage media for temporarily and/or more permanently containing, storing, transmitting, and retrieving computer-readable information.

Computer-readable storage media 1022 containing code, or portions of code, can also include any appropriate media, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 1000.

By way of example, computer-readable storage media 1022 may include a hard disk drive that reads from or writes to non-removable, nonvolatile magnetic media, a magnetic disk drive that reads from or writes to a removable, non-volatile magnetic disk, and an optical disk drive that reads from or writes to a removable, nonvolatile optical disk such as a CD ROM, DVD, and Blu-Ray® disk, or other optical media. Computer-readable storage media 1022 may include, but is not limited to, Zip® drives, flash memory cards, universal serial bus (USB) flash drives, secure digital (SD) cards, DVD disks, digital video tape, and the like. Computer-readable storage media 1022 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 1000.

Communications subsystem 1024 provides an interface to other computer systems and networks. Communications subsystem 1024 serves as an interface for receiving data from and transmitting data to other systems from computer system 1000. For example, communications subsystem 1024 may enable computer system 1000 to connect to one or more devices via the Internet. In some embodiments communications subsystem 1024 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 1024 can provide wired network connectivity (e.g., Ethernet) in addition to or instead of a wireless interface.

In some embodiments, communications subsystem 1024 may also receive input communication in the form of structured and/or unstructured data feeds 1026, event streams 1028, event updates 1030, and the like on behalf of one or more users who may use computer system 1000.

By way of example, communications subsystem 1024 may be configured to receive data feeds 1026 in real-time from users of social networks and/or other communication services such as Twitter® feeds, Facebook® updates, web feeds such as Rich Site Summary (RSS) feeds, and/or real-time updates from one or more third party information sources.

Additionally, communications subsystem 1024 may also be configured to receive data in the form of continuous data streams, which may include event streams 1028 of real-time events and/or event updates 1030, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 1024 may also be configured to output the structured and/or unstructured data feeds 1026, event streams 1028, event updates 1030, and the like to one or more databases that may be in communication with one or more streaming data source computers coupled to computer system 1000.

Computer system 1000 can be one of various types, including a handheld portable device (e.g., an iPhone® cellular phone, an iPad® computing tablet, a PDA), a wearable device (e.g., a Google Glass® head mounted display), a PC, a workstation, a mainframe, a kiosk, a server rack, or any other data processing system.

Due to the ever-changing nature of computers and networks, the description of computer system 1000 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, other ways and/or methods to implement the various embodiments should be apparent.

As used herein, the terms "about" or "approximately" or "substantially" may be interpreted as being within a range that would be expected by one having ordinary skill in the art in light of the specification.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "wafer" includes silicon wafers as well as other substrates on which micro-scale features are formed. As used herein and in the appended claims, the singular forms "a", "an", and "the" include plural referents unless the context clearly dictates otherwise. The terms above or below refer to the direction of gravity with the apparatus in its customary orientation. The invention has now been described in detail for the purposes of clarity and understanding. However, it will be appreciated that certain changes and modifications may be practice within the scope of the appended claims.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A method of characterizing seals around wafers during plating processes, the method comprising:

causing a wafer to be rotated in a plating chamber, wherein the wafer is enclosed in a carrier that forms a seal around a periphery of the wafer, and the seal is electrically coupled to a conductive layer on the wafer through electrical contacts inside the seal;

causing current to flow from an electrode in the plating chamber to the conductive layer on the wafer while the wafer is being rotated, wherein the current then flows through the conductive layer into the electrical contacts inside the seal;

causing an electrical characteristic associated with the current to be measured while the current flows from the electrode to the conductive layer; and generating a characterization of how well the seal is electrically coupled to the conductive layer on the wafer around the periphery of the wafer based on the electrical characteristic.

2. The method of claim 1, wherein the conductive layer on the wafer comprises a uniform seed layer that extends underneath the seal, and the uniform seed layer is a top-most layer on the wafer without a mask layer on top of the uniform seed layer.

3. The method of claim 1, wherein the current comprises a constant current from a current source.

4. The method of claim 3, wherein the electrical characteristic associated with the current comprises a voltage required to drive the constant current as the wafer rotates.

5. The method of claim 4, further comprising generating a map of voltages corresponding to locations around the periphery of the wafer, wherein higher voltages represent areas where the seal is not sufficiently electrically coupled to the conductive layer through the electrical contacts inside the seal.

6. A method of characterizing wafers during plating processes, the method comprising:

causing a wafer to be rotated in a plating chamber, wherein the wafer comprises openings in a top layer that expose areas of a conductive layer underneath the top layer;

causing current to flow from an electrode in the plating chamber to the conductive layer on the wafer while the wafer is being rotated;

causing an electrical characteristic associated with the current to be measured while the current flows from the electrode to the conductive layer;

generating a characterization of the openings in the top layer based on the electrical characteristic; and adjusting an amount of current stolen by one or more thief electrodes based on the characterization of the openings in the top layer.

7. The method of claim 6, wherein the one or more thief electrodes steal more current at locations on the wafer where the openings in the top layer are most sparse.

8. The method of claim 6, wherein the one or more thief electrodes steal less current at locations on the wafer where the openings in the top layer are most dense.

9. The method of claim 6, wherein the current comprises a constant current from a current source and the electrical characteristic associated with the current comprises a voltage required to drive the constant current as the wafer rotates.

10. The method of claim 9, further comprising generating a map of voltages corresponding to locations around a periphery of the wafer, wherein higher voltages represent locations where openings in the top layer are most sparse.

11. The method of claim 6, further comprising:

causing a second wafer to be rotated in the plating chamber, wherein the second wafer is enclosed in a carrier that forms a seal around a periphery of the second wafer, and the seal is electrically coupled to a conductive layer on the second wafer through electrical contacts inside the seal;

causing a second current to flow from the electrode in the plating chamber to the conductive layer on the second wafer while the second wafer is being rotated, wherein the second current then flows through the conductive layer into the electrical contacts inside the seal;

causing a second electrical characteristic associated with the second current to be measured while the second current flows from the electrode to the conductive layer; and generating a characterization of how well the seal is electrically coupled to the conductive layer on the second wafer around the periphery of the second wafer based on the second electrical characteristic.

12. The method of claim 11, further comprising:

combining the characterization of how well the seal is electrically coupled to the conductive layer on the second wafer and the characterization of the openings in the top layer to generate a mapping of the wafer.

* * * * *